US011990747B2

United States Patent
Uemura et al.

(10) Patent No.: US 11,990,747 B2
(45) Date of Patent: *May 21, 2024

(54) ELECTROSTATIC PROTECTION CIRCUIT AND SEMICONDUCTOR INTEGRATED CIRCUIT

(71) Applicant: SUMITOMO ELECTRIC INDUSTRIES, LTD., Osaka (JP)

(72) Inventors: Hiroshi Uemura, Osaka (JP); Keiji Tanaka, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/528,706

(22) Filed: Nov. 17, 2021

(65) Prior Publication Data
US 2022/0158447 A1     May 19, 2022

(30) Foreign Application Priority Data

Nov. 19, 2020    (JP) ................................ 2020-192372

(51) Int. Cl.
*H02H 9/04*        (2006.01)
*H01L 27/02*      (2006.01)
(Continued)

(52) U.S. Cl.
CPC .......... *H02H 9/046* (2013.01); *H02H 1/0007* (2013.01); *H03K 17/0826* (2013.01); *H01L 27/0248* (2013.01)

(58) Field of Classification Search
CPC .. H02H 9/046; H02H 1/0007; H03K 17/0826; H01L 27/0248; H01L 27/0266; H01L 27/0255
(Continued)

(56) References Cited

U.S. PATENT DOCUMENTS 6,624,992 B1 *   9/2003   Aparin ................... H02H 9/046
                                                          361/58
9,368,485 B1 *   6/2016   Chu ..................... H01L 27/0255
(Continued)

FOREIGN PATENT DOCUMENTS

| CN | 101634885 A | * | 1/2010 | |
|---|---|---|---|---|
| JP | 2015-173214 | | 10/2015 | |
| WO | WO-2022271455 A1 | * | 12/2022 | ......... H01L 27/0255 |

OTHER PUBLICATIONS

CA Notice of Allowance dated Sep. 20, 2023 for co-pending U.S. Appl. No. 17/528,861.
(Continued)

*Primary Examiner* — Dharti H Patel
(74) *Attorney, Agent, or Firm* — SMITH, GAMBRELL & RUSSELL, LLP (57) ABSTRACT

An electrostatic protection circuit includes first and second output terminals, a first diode circuit connected between the first output terminal and a common node, a second diode circuit connected between the second output terminal and the common node, an intermediate voltage circuit that is connected between the first output terminal and the second output terminal and that is configured to generate, at the common node, an intermediate voltage having an intermediate voltage value between a voltage value of the first output terminal and a voltage value of the second output terminal, and a clamp circuit configured to electrically connect the common node to a ground line in accordance with the intermediate voltage.

12 Claims, 8 Drawing Sheets

(51) Int. Cl.
*H02H 1/00* (2006.01)
*H03K 17/082* (2006.01)

(58) Field of Classification Search
USPC .......................................................... 361/56
See application file for complete search history.

(56) References Cited

U.S. PATENT DOCUMENTS

| | | | |
|---|---|---|---|
| 10,424,950 B2* | 9/2019 | Chen | H01L 27/0255 |
| 2012/0306540 A1* | 12/2012 | Komatsu | H03K 19/00361 |
| | | | 327/77 |
| 2014/0036401 A1* | 2/2014 | Komatsu | H02H 3/24 |
| | | | 361/92 |
| 2015/0263505 A1* | 9/2015 | Takada | H02H 9/046 |
| | | | 361/56 |
| 2016/0336741 A1* | 11/2016 | Chen | H01L 27/0255 |
| 2019/0097420 A1* | 3/2019 | Chen | H01L 27/0285 |

OTHER PUBLICATIONS

Office action dated Feb. 13, 2023 for co-pending U.S. Appl. No. 17/528,861.

\* cited by examiner

ELECTROSTATIC PROTECTION CIRCUIT AND SEMICONDUCTOR INTEGRATED CIRCUIT

CROSS-REFERENCE TO RELATED APPLICATION

This application claims priority based on Japanese Patent Application No. 2020-192372, filed on Nov. 19, 2020, and the entire contents of the Japanese patent application are incorporated herein by reference.

TECHNICAL FIELD

The present disclosure relates to an electrostatic protection circuit and a semiconductor integrated circuit.

BACKGROUND

As a circuit built in an optical transmitter module or the like, an output circuit that generates an output signal in accordance with an input voltage signal is used. For example, the output circuit outputs a drive signal for driving an optical modulator. In such an output circuit, protection against electrostatic discharge (ESD) may be necessary. Patent Literature 1 (Japanese Patent Application Laid-Open No. 2015-173214) discloses an output circuit which is of an open-drain type and includes a signal output terminal, a floating line, a diode that causes a current to flow from the signal output terminal to the floating line, and an ESD protection circuit that connects the floating line to a ground potential when an ESD current flows into the floating line.

SUMMARY

An electrostatic protection circuit according to an aspect of the present disclosure includes a first output terminal and a second output terminal; a first diode circuit connected between the first output terminal and a common node; a second diode circuit connected between the second output terminal and the common node; an intermediate voltage circuit that is connected between the first output terminal and the second output terminal and that is configured to generate, at the common node, an intermediate voltage having an intermediate voltage value between a voltage value of the first output terminal and a voltage value of the second output terminal; and a clamp circuit configured to electrically connect the common node to a ground line in accordance with the intermediate voltage.

DETAILED DESCRIPTION

Hereinafter, embodiments according to the present disclosure will be described in detail with reference to the drawings. In the description of the drawings, same or corresponding elements are denoted by same reference numerals and redundant descriptions thereof will be omitted.

Figure 1:
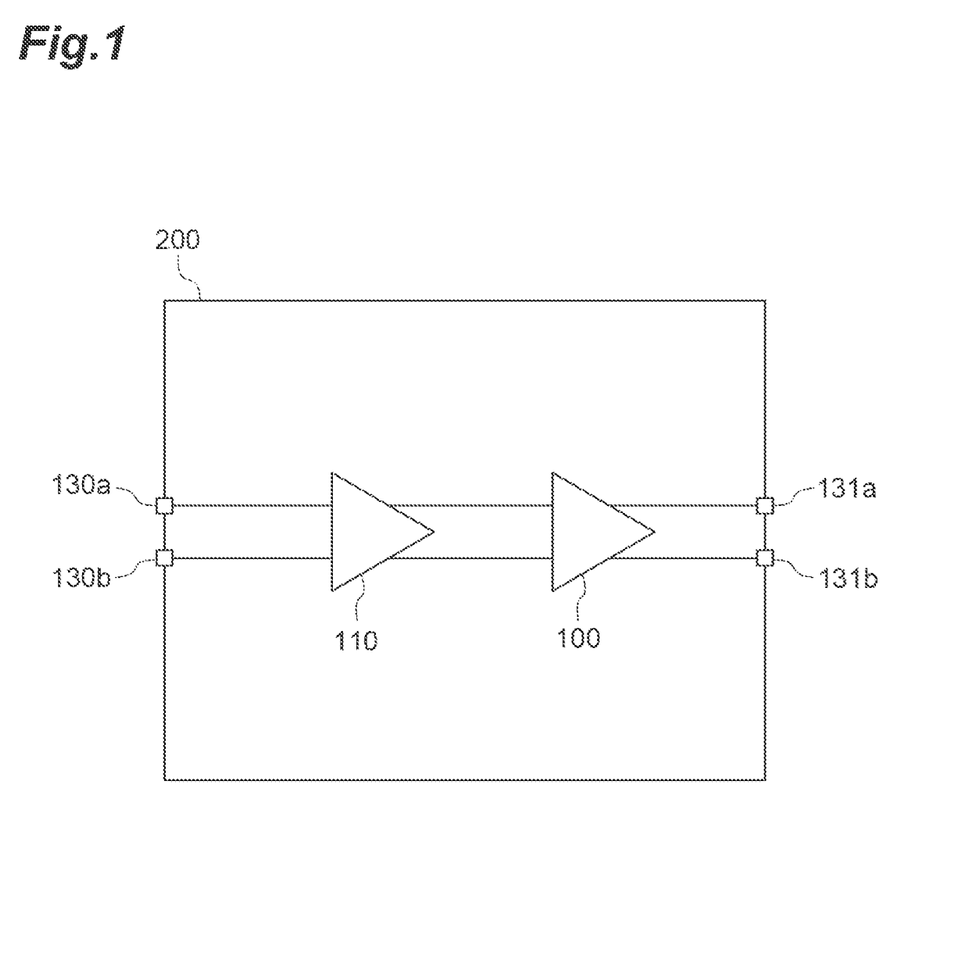
FIG. 1 is a block diagram illustrating a schematic configuration of a drive circuit 200 according to an embodiment of a semiconductor integrated circuit of the present disclosure.

FIG. 1 is a block diagram illustrating a configuration of a drive circuit 200 according to an embodiment of a semiconductor integrated circuit of the present disclosure. Drive circuit 200 is built in a device for optical communication such as an optical transmitter module. Drive circuit 200 is a semiconductor integrated circuit (IC) manufactured by a semiconductor process such as a SiGe bipolar complementary metal oxide semiconductor (BiCMOS), which has a size of 2 mm×4 mm. Drive circuit 200 amplifies an input voltage signal and outputs the amplified voltage signal. Drive circuit 200 includes a pair of input terminals 130a and 130b, a pair of output terminals 131a and 131b, an input circuit 110, and an output circuit 100. In the following description, the IC may also be referred to as a semiconductor chip.

Input terminals 130a and 130b receives a differential signal which includes, for example, two signals having same amplitudes and reversed phases to each other. Input circuit 110 amplifies the input differential signal and outputs the amplified differential signal to output circuit 100. Output circuit 100 further amplifies the differential signal output from input circuit 110 and outputs the amplified differential signal to an outside of drive circuit 200. For example, output circuit 100 is cascade-connected to the input circuit 110.

Note that the circuit configuration of drive circuit 200 may be changed as appropriate, input circuit 110 may be omitted, or various other circuits may be added. In addition, the number of signal transmission paths (channels) is not limited to one, and a plurality of channels (for example, four channels) may be arranged in parallel.

Next, the configuration of output circuit 100 which is the semiconductor integrated circuit of the present embodiment will be described with reference to FIGS. 2 and 3. In the following description, a voltage will be described with reference to a ground potential (0V) unless otherwise specified. For example, when a potential of a certain node in the circuit is Vnode, the potential difference between the potential of the node and the ground potential is a voltage Vnode. Therefore, the potential of the node and the voltage of the node represent the same thing. Although an operation of a circuit is described using a voltage as a term, the voltage also means a potential. When the ground potential is not used as a reference, a reference potential (source potential) is indicated by describing as in the case of a gate-source voltage, for example.

Figure 2:
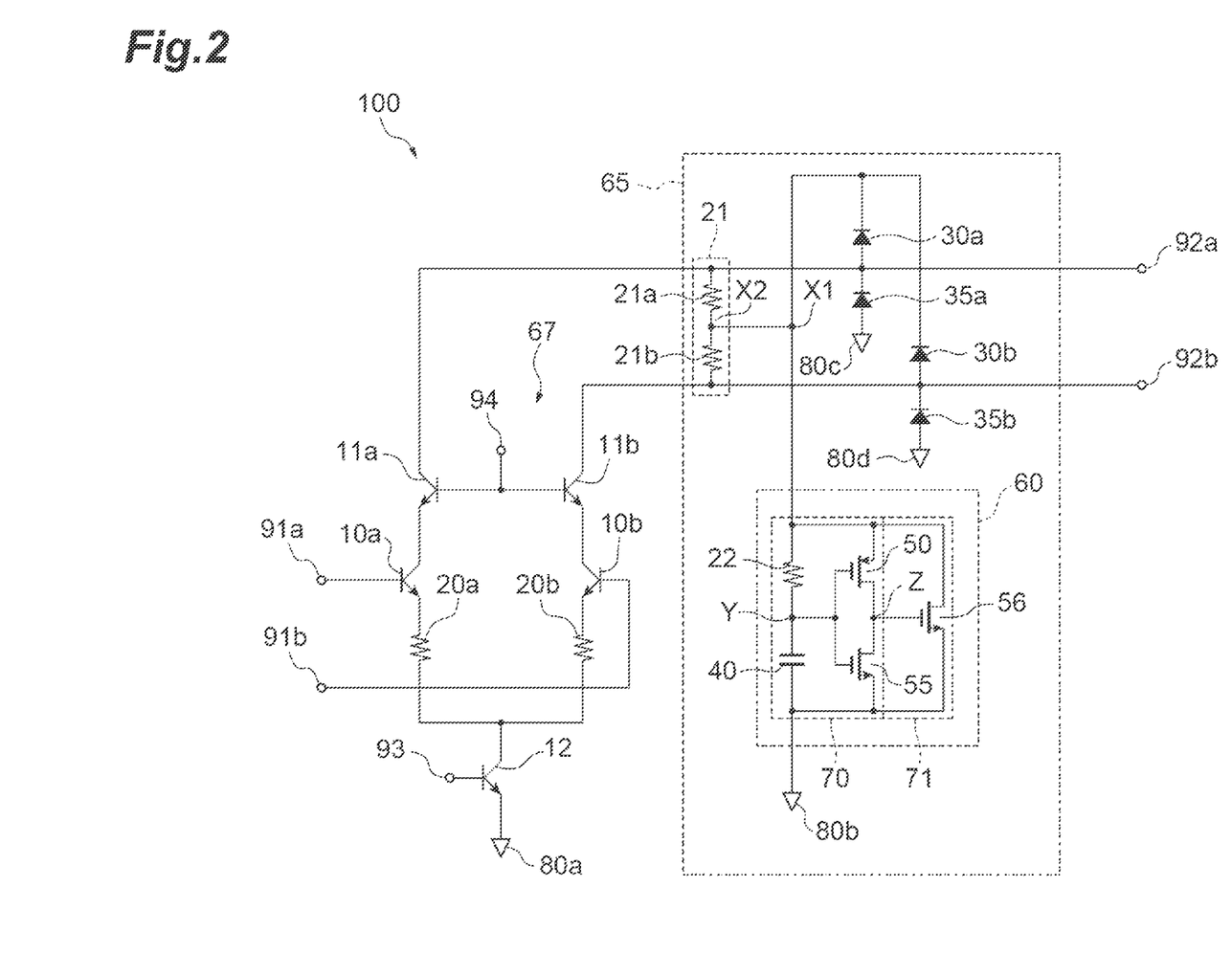
FIG. 2 is a circuit diagram illustrating a configuration of an electrostatic protection circuit according to an embodiment.

FIG. 2 is a circuit diagram illustrating a configuration of an electrostatic protection circuit according to an embodiment. FIG. 2 illustrates a configuration of output circuit 100 including an electrostatic protection circuit 65, an internal circuit 67 to which electrostatic protection circuit 65 is connected, and the like. Output circuit 100 is a differential amplifier circuit that outputs a differential current signal that is a current signal in accordance with a differential signal that is an input voltage signal. Output circuit 100 is an integrated circuit formed on a Si substrate by a semiconductor process such as SiGe BiCMOS. A maximum power supply voltage of the integrated circuit on which output circuit 100 is mounted is, for example, 3.3 V. The input differential signal is, for example, a constant amplitude binary signal (for example, an NRZ (Non Return to Zero) signal) or an amplitude-modulated signal having multiple values (for example, a PAM (Pulse Amplitude Modulation) 4 signal having four levels). Modulation speeds of these signals are, for example, 100 GBaud.

Output circuit 100 includes bipolar transistors 10a, 10b, 11a, 11 b, and 12, resistors 20a, 20b, 21a, 21b, and 22, diodes (diode circuits) 30a, 30b, 35a, and 35b, a capacitor 40, metal oxide semiconductor (MOS) transistors 50, 55, and 56, input signal terminals 91a and 91b, output signal terminals 92a and 92b, ground lines 80a, 80b, 80c, and 80d, and bias supply terminals 93 and 94. A clamp circuit 60 includes resistor 22, capacitor 40, and MOS transistors 50, 55, and 56 among these components. Electrostatic protection circuit (ESD protection circuit) 65 includes clamp circuit 60, diodes 30a, 30b, 35a, and 35b, resistors 21a and 21b, and ground lines 80b, 80c, and 80d. An internal circuit 67, which is a differential amplifier circuit electrically connected to a pair of output signal terminals 92a (first output terminal) and 92b (second output terminal), includes bipolar transistors 10a, 10b, 11 a, 11b, and 12, resistors 20a and 20b, input signal terminals 91a and 91b, bias supply terminals 93 and 94, and ground line 80a.

First, components included in internal circuit 67 will be described.

In bipolar transistor 10a, the base is connected to input signal terminal 91a, the collector is connected to the emitter of bipolar transistor 11a, and the emitter is connected to one end of resistor 20a. In bipolar transistor 10b, the base is connected to input signal terminal 91b, the collector is connected to the emitter of bipolar transistor 11b, and the emitter is connected to one end of resistor 20b. Bipolar transistors 10a and 10b may be, for example, an NPN-type heterojunction bipolar transistor (HBT). Bipolar transistors 10a and 10b may be replaced with, for example, n-type MOS transistors.

In bipolar transistor 11a, the base is connected to bias supply terminal 94, the emitter is connected to the collector of bipolar transistor 10a, and the collector is connected to output signal terminal 92a. In bipolar transistor 11b, the base is connected to bias supply terminal 94, the emitter is connected to the collector of bipolar transistor 10b, and the collector is connected to output signal terminal 92b. Bipolar transistors 11a and 11b are, for example, cascode transistors. For example, a DC voltage is applied to each base of bipolar transistors 11a and 11b through bias supply terminal 94. With this configuration, voltage amplitudes at collectors of bipolar transistors 10a and 10b are suppressed, and mirror effect of a capacitance between the base and the collector of each of bipolar transistors 10a and 10b is suppressed. Therefore, it is possible to widen a bandwidth of output circuit 100. Furthermore, since an output resistance of output circuit 100 increases due to the presence of bipolar transistors 11a and 11b, a voltage gain of output circuit 100 can be improved. Bipolar transistors 11a and 11b may be replaced with, for example, n-type MOS transistors. When the bandwidth of output circuit 100 is sufficiently wide, bipolar transistors 11a and 11b may be omitted.

One end of each of resistors 20a and 20b is connected to each emitter of bipolar transistors 10a and 10b, and the other end of each of resistors 20a and 20b is connected to a collector of bipolar transistor 12. Resistors 20a and 20b are degeneration resistors and allow output circuit 100 to expand its linear input range. Resistors 20a and 20b are, for example, n-type poly-Si resistors. When the linear input range of output circuit 100 is sufficiently wider than a use range, resistors 20a and 20b may be omitted.

In bipolar transistor 12, the collector is connected to the other end of each of resistors 20a and 20b, a base is connected to bias supply terminal 93, and an emitter is connected to ground line 80a, so that bipolar transistor 12 functions as a current source. Bipolar transistor 12 generates a current corresponding to a voltage of bias supply terminal 93, and a current value is, for example, 60 mA. Internal circuit 67 may be configured such that a base voltage of another diode-connected bipolar transistor is applied to bias supply terminal 93. In this case, a current mirror is formed, and the amount of a current generated by bipolar transistor 12 is easily adjusted. Therefore, bipolar transistor 12 may be a variable current source. Instead of bipolar transistor 12, a MOS transistor may also be used. Also, instead of bipolar transistor 12, a resistor or a circuit including a resistor and an inductor may be used.

Output circuit 100 including internal circuit 67 having the above-described configuration includes a pair of bipolar transistors 10a and 10b that are connected in parallel to each other between the ground potential and a pair of output signal terminals 92a and 92b. The base of bipolar transistor 10a is connected to input signal terminal 91a and the base of bipolar transistor 10b is connected to input terminal 92b. The pair of bipolar transistors 10a and 10b functions as a differential amplifier circuit that amplifies a differential signal input from the pair of input signal terminals 91a and 91b, and outputs the amplified differential signal to the pair of output signal terminals 92a and 92b.

Here, output circuit 100 may be referred to as open collector circuit, because the collectors of bipolar transistors 11a and 11b are connected to output signal terminals 92a and 92b, respectively without being terminated, that is, without being electrically connected to an internal power supply line or an internal ground line through an internal resistor (for example, a resistor in the integrated circuit on which output circuit 100 is mounted). When bipolar transistors 10a, 10b, 11a, and 11b are replaced with MOS transistors, output circuit 100 is referred to as an open drain circuit.

Figure 3:
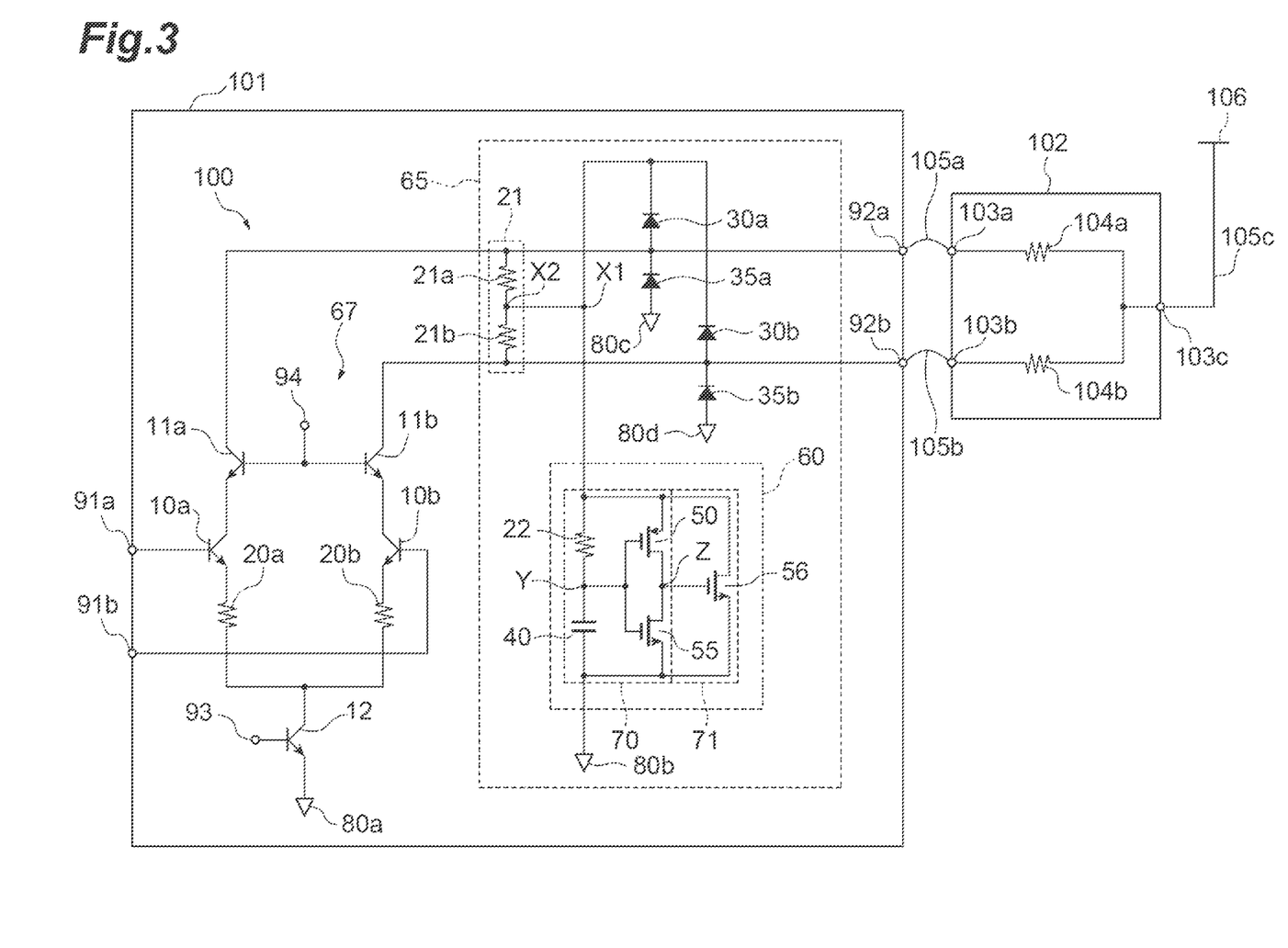
FIG. 3 is a circuit diagram illustrating the output circuit 100 in FIG. 1 connected to an external load.

FIG. 3 illustrates a configuration of output circuit 100 that is connected to an external load. FIG. 3 illustrates an IC101 which is mounted on a communication apparatus, for example. As illustrated in FIG. 3, in output circuit 100 mounted on IC101, output signal terminals 92a and 92b are connected to an external load 102 to which a predetermined voltage (for example, 5.0 V) is applied by an external power supply 106. That is, each of output signal terminals 92a and 92b is connected to respective connection terminals 103a and 103b of external load 102 through each of electrical wirings 105a and 105b. External load 102 includes load resistors 104a and 104b that are each disposed between connection terminals 103a and 103c and between connection terminals 103b and 103c, respectively, and that have predetermined resistance values (for example, 30Ω). Connection terminal 103c is connected to external power supply 106 through an electrical wiring 105c. As a result, output signal terminal 92a is terminated at external power supply 106 through load resistor 104a, and output signal terminal 92b is terminated at external power supply 106 through load resistor 104b. With such a connection configuration, a voltage value of a differential signal at output signal terminals 92a and 92b is determined mainly by a voltage of external power supply 106, resistance values of load resistors 104a and 104b, and an output current of output circuit 100.

In other words, the differential current signal output from the pair of output signal terminals 92a and 92b is converted to a differential voltage signal by load resistors 104a and 104b. More specifically, for example, a positive phase signal of the differential voltage signal is generated by load resistor 104a, and a negative phase signal of the differential voltage signal is generated by load resistor 104b. The positive phase signal and the negative phase signal are a pair of complementary signals and constitute the differential voltage signal. For example, when the positive phase signal increases, the negative phase signal decreases, and when the positive phase signal decreases, the negative phase signal increases. The negative phase signal has a phase opposite to the phase of the positive phase signal. For example, when the positive-phase signal reaches a maximum value (peak voltage), the negative-phase signal reaches a minimum value (bottom voltage), and when the positive-phase signal reaches a minimum value (bottom voltage), the negative-phase signal reaches a maximum value (peak voltage). Preferably, the negative phase signal has the same amplitude as the amplitude of the positive phase signal. It is preferable that the negative phase signal has the same mean voltage value (DC component) as the mean voltage value (DC component) of the positive phase signal.

Next, components of ESD protection circuit 65 will be described.

Resistors 21a (first dividing resistor) and 21b (second dividing resistor) constitute an intermediate voltage circuit 21 that generates an intermediate voltage having an intermediate voltage value between voltage values of a pair of output signal terminals, that is, between a voltage value of output signal terminal 92a and a voltage value of output signal terminal 92b. That is, resistor 21a is a resistor connected between output signal terminal 92a and a second node X2. Resistor 21b is a resistor connected between output signal terminal 92b and second node X2. Resistor 21b has a resistance value substantially equal to the resistance value of resistor 21a. Resistors 21a and 21b constitute intermediate voltage circuit 21 which outputs an intermediate voltage at second node X2. Intermediate voltage circuit 21 generates, at second node X2, an output common-mode voltage which is the intermediate voltage having an intermediate voltage value between voltages of a pair of output signal terminals, that is, between a voltage value of output signal terminal 92a and a voltage value of output signal terminal 92b when no ESD occurs (when no differential signal is input to the pair of input signal terminals 91a and 91b and internal circuit 67 does not perform an operation of amplification (no signal state) or when internal circuit 67 performs an operation of amplifying a differential signal). When ESD occurs, intermediate voltage circuit 21 generates, at second node X2, a voltage substantially equal to the intermediate voltage between voltages of output signal terminals 92a and 92b until diodes 30a and 30b described later are turned on. After diodes 30a and 30b are turned on, the voltage at second node X2 is no longer the intermediate voltage between voltages of output signal terminals 92a and 92b. For example, the voltage at second node X2 exceeds the predetermined voltage of external power supply 106 due to the input of an ESD voltage.

Resistance values of resistors 21a and 21b are preferably at least 10 times or more, more preferably 100 times or more as large as the resistance values of load resistors 104a and 104b of external load 102. In the former case, a combined load resistance is about 90% of the resistance values of load resistors 104a and 104b, and in the latter case, a combined load resistance is about 99% of the resistance values of load resistors 104a and 104b, and the influence of intermediate voltage circuit 21 on a signal voltage output during an operation of amplification is suppressed. In the present embodiment, for example, each resistance value of resistors 21a and 21b is set to 5 kΩ. An output common-mode voltage generated by resistors 21a and 21b is, for example, 4.0 V. Note that "resistance values are substantially equal" means that the resistance values may be different from each other within a practically acceptable range. An acceptable range is, for example, a relative error of 5% or less. Intermediate voltage circuit 21 is, for example, a resistance dividing circuit having a voltage dividing ratio of 1/2.

A pair of diodes 30a and 30b are diodes for ESD protection that connects each of the output signal terminals 92a and 92b to a first node X1. Diode 30a (first diode) is included in a diode circuit (first diode circuit), and has an anode connected to output signal terminal 92a and a cathode connected to a common node (first node) X1. Diode 30b (second diode) is included in a diode circuit (second diode circuit), and has an anode connected to output signal terminal 92b and a cathode connected to common node (first node) X1. Diodes 30a and 30b are, for example, PN junction diodes formed in a P-type well in a semiconductor chip (semiconductor integrated circuit). Diodes 30a and 30b serve as discharge paths when a positive ESD voltage is input to output signal terminals 92a and 92b. In the present embodiment, second node X2 and first node X1 are electrically connected to each other, so that voltages at both nodes are substantially equal to each other.

A pair of diodes 35a and 35b are diodes for ESD protection. Diode 35a has a cathode connected to output signal terminal 92a and an anode connected to ground line 80c. Diode 35b has a cathode connected to output signal terminal 92b and an anode connected to ground line 80d. Diodes 35a and 35b are, for example, PN junction diodes formed in an N-type well in a semiconductor chip (semiconductor integrated circuit). Diode 35a and 35b serves as discharge paths when a negative ESD voltage is input to output signal terminals 92a and 92b.

Clamp circuit 60 is configured to ground first node X1 by setting a resistance between first node X1 and ground line 80b to a low resistance value (first resistance) in response to a generation of a positive ESD voltage at first node X1 as a trigger. Here, clamp circuit 60 is a circuit for preventing dielectric breakdown of internal circuit 67 in output circuit 100 by suppressing inflow of a discharge current due to ESD at output signal terminals 92a and 92b into internal circuit 67.

A commonly used clamp circuit is often used with connected between an internal power supply and a ground line. On the other hand, output circuit 100 of the present embodiment is an open collector circuit, and it is terminated by an external power supply that has, for example, a power supply voltage of 5.0 V. A voltage of internal power supply of the output circuit is, for example, 3.3 V, which is lower than the output common-mode voltage (for example, 4.0 V) when external load 102 is connected to output signal terminals 92a and 92b. As a result, it is difficult to adopt a configuration in which clamp circuit 60 is connected to the internal power supply because when output circuit 100 performs an operation of amplification, diodes 30a and 30b are turned on and a current flows from output signal terminals 92a and 92b to the internal power supply. It is also conceivable to avoid the turn-on of the diodes by adopting a configuration in which a plurality of diodes are connected in series instead of the single diode 30a (or 30b), but in this case, a voltage at output signal terminals 92a and 92b at the time of occurrence of an ESD increases, and there is a possibility that ESD protection becomes insufficient. Therefore, in the present embodiment, clamp circuit 60 is connected between ground line 80b and first node X1 where an output common-mode voltage is generated. Clamp circuit 60 has a configuration in which internal elements are selected and a circuit is designed for a voltage of first node X1.

Clamp circuit 60 includes a detection circuit 70 and a switch circuit 71. Detection circuit 70 detects that an ESD voltage is input to output signal terminals 92a and 92b based on the intermediate voltage. Detection circuit 70 includes, for example, a resistor 22, a capacitor 40, and MOS transistors 50 and 55.

Resistor 22 and capacitor 40 form a low pass filter (also referred to as an integrator circuit). That is, resistor (detection resistor) 22 is connected between first node X1 and a detection node Y. Capacitor 40 is connected between detection node Y and ground line 80b. With such a configuration, for example, when a step-like voltage pulse is generated at first node X1, a voltage corresponding to the voltage of first node X1 is generated at node Y between resistor 22 and capacitor 40 after a delay time of about a time constant determined by the product of a resistance value of resistor 22 and a capacitance of capacitor 40.

MOS transistors 50 and 55 constitute an inverter circuit. MOS transistor 50 is a P-type MOS transistor, and has a source connected to first node X1, a drain connected to a node Z, and a gate connected to node Y. MOS transistor 55 is an N-type MOS transistor, and has a source connected to ground line 80b, a drain connected to the drain of MOS transistor 50 through node Z, and a gate connected to node Y. In this inverter circuit, in response to an increase in voltage at first node X1, a voltage of node Z is changed in accordance with a voltage of node Y. When the voltage of node Y is lower than a threshold voltage of the inverter circuit, MOS transistor 50 is turned on, and the output at node Z of the inverter circuit becomes substantially equal to the voltage of first node X1. On the other hand, when the voltage of node Y is higher than the threshold voltage of the inverter circuit, MOS transistor 55 is turned on, and the output (node Z) of the inverter circuit becomes substantially equal to the voltage (ground voltage) of ground line 80b. That is, when the voltage of node Y is low, the voltage of node Z becomes high, when the voltage of node Y is high, the voltage of node Z becomes low, and the voltage of node Z has an inverted relationship with the voltage of node Y.

As described above, the inverter circuit formed by MOS transistors 50 and 55 inverts the voltage of node Y to generate a trigger signal at node Z. Note that the inverter circuit operates using the voltage of first node X1 as a power supply voltage. Therefore, the voltage output as a high level by the inverter circuit changes in accordance with the voltage of first node X1. Here, in the present embodiment, the inverter circuit has a one stage configuration, but may be modified to a configuration in which an odd number of three or more inverter circuits are cascade-connected. Note that in the case where the number of inverter circuits is increased, the time until the voltage of node Z changes in accordance with the voltage of node Y becomes longer due to delay times of the inverter circuits.

Detection circuit 70 outputs a trigger signal to node Z in response to a detection of a change in the intermediate voltage, that is, in accordance with the intermediate voltage and the voltage at node Y. Further, detection circuit 70 generates a trigger signal during a delay time of about a time constant determined by the product of the resistance value of resistor 22 and the capacitance of capacitor 40, that is, during a predetermined period of time. Further, detection circuit 70 generates a trigger signal when the voltage of node Y exceeds the threshold value of the inverter circuit, that is, a predetermined value, in accordance with the voltage of first node X1. For example, as will be described later, MOS transistor 56 is turned off by the trigger signal.

MOS transistor 56 is a switching element including an N-type MOS transistor, and has a drain connected to first node X1, a source connected to ground terminal 80b, and a gate connected to node Z which is an output node of the inverter circuit. MOS transistor 56 is included in a switch circuit 71 which turns on/off in response to an output of detection circuit 70 as a trigger signal, and operates so as to be turned on and lower a drain-source resistance (this state is referred to as an on-state) when the voltage of node Z is higher than a threshold voltage of MOS transistor 56. On the other hand, MOS transistor 56 is turned off when the voltage of node Z is lower than the threshold voltage of MOS transistor 56, and operates so as to increase the drain-source resistance. With such a configuration, using the voltage of node Z as a trigger, MOS transistor 56 performs a switching to a state (conduction state) in which an electrical resistance between first node X1 and ground line 80b is set to a low resistance value (first resistance) in response to the increase in voltage of first node X1. Thereby, the voltage of first node X1 is clamped to a relatively low voltage value.

On the other hand, when the voltage of first node X1 is not increased by the input of a ESD voltage, MOS transistor 56 performs a switching to a state (non-conduction state) in which the electrical resistance between first node X1 and ground line 80b is set to a high resistance value (second resistance). The electrical resistance between first node X1 and ground line 80b has a value depending on the electrical characteristics of MOS transistor 56. For example, the low resistance value (first resistance) in a conduction state is equal to an on-resistance between the drain and the source of MOS transistor 56, and the high resistance value (second resistance) in a non-conduction state is equal to an electrical resistance between the drain and the source of MOS transistor 56 in an off-state. Therefore, the second resistance is greater than the first resistance.

A timing at which MOS transistor 56 is turned on and a voltage at first node X1 required for MOS transistor 56 to be turned on can be appropriately adjusted in accordance with designs of detection circuit 70 and switch circuit 71. In addition, for example, the designs of detection circuit 70 and switch circuit 71 are adjusted so that MOS transistor 56 is never turned on when an output common-mode voltage that is generated at second node X2 during an amplification operation of internal circuit 67 is lower than a predetermined voltage (for example, 5.0 V) of external power supply 106. That is, the designs of detection circuit, inverter circuit, and switch circuit are adjusted so that first node X1 and ground line 80b are in a conduction state when an ESD voltage significantly exceeding the predetermined voltage (for example, 5.0 V) of external power supply 106 is input to output signal terminals 92a and 92b.

An ESD protection operation in output circuit 100 having the above-described configuration will be described. Note that an ESD may occur at either one or both of output signal terminals 92a and 92b. For example, in FIG. 3, upon connecting electrical wiring 105a to output signal terminal 92a, there is a possibility that the ESD occurs at output signal terminal 92a. Similarly, upon connecting electrical wiring 105b to output signal terminal 92b, there is a possibility that the ESD occurs at output signal terminal 92b. Further, upon connecting electrical wiring 105c to connection terminal 103c in a state where electrical wiring 105a and 105b are connected to IC101, there is a possibility that the ESD occurs at both of output signal terminals 92a and 92b. Since the ESD protection operation is the same in any cases, the following description will be given without distinction.

First, when a negative ESD voltage is input to output signal terminals 92a and 92b, a current flows from ground lines 80c and 80d to output signal terminals 92a and 92b through diodes 35a and 35b. Accordingly, it is possible to suppress an increase in the negative ESD voltage at output signal terminals 92a and 92b and suppress a discharge current due to the ESD from flowing to internal circuit 67, thereby preventing dielectric breakdown of output circuit 100.

Next, when a positive ESD voltage is input to output signal terminals 92a and 92b, a discharge current flows from output signal terminals 92a and 92b to first node X1 through diodes 30a and 30b and resistors 21a and 21b, so that a voltage of first node X1 increases. Due to the detection circuit 70 of clamp circuit 60, an increase in voltage of node Y is delayed as compared with first node X1. Accordingly, MOS transistor 50 of the inverter circuit of clamp circuit 60 is turned on because the voltage of node Y is lower than a threshold voltage of the inverter circuit and the inverter circuit is supplied with a power supply voltage (a voltage of first node X1), and a voltage of node Z increases. As a result, MOS transistor 56 is turned on, and a resistance between first node X1 and ground line 80b becomes small, so that the increase in voltage of first node X1 is suppressed and the flow of the discharge current of the ESD into internal circuit 67 is suppressed. In this way, it is possible to prevent dielectric breakdown of output circuit 100.

When the input of the ESD voltage stops in a state where MOS transistor 56 is turned on, the voltage of first node X1 decreases, and the voltage of node Z also decreases accordingly. When the voltage of node Z decreases to the threshold voltage of MOS transistor 56, MOS transistor 56 is turned off, so that the decrease in voltage of first node X1 stops. Thereafter, when output circuit 101 performs an operation of amplification, the voltage of first node X1 is biased with an output common-mode voltage. In addition, when the voltage of first node X1 increases due to the input of the ESD voltage, the voltage of node Y increases with a delay as described above, and when the voltage of node Y exceeds the threshold voltage of the inverter circuit, the voltage of node Z (trigger signal) decreases toward the ground potential. When the voltage of node Z becomes lower than the threshold voltage of MOS transistor 56, MOS transistor 56 is turned off. Therefore, the clamp circuit turns off MOS transistor 56 to stop a clamp operation after an elapse of a predetermined time from the detection of the increase in voltage of first node X. This prevents, for example, MOS transistor 56 from being erroneously turned on and affecting the output signal while output circuit 101 performs an operation of amplification.

In output circuit 100 of the present embodiment, as described above, a current flows from output signal terminals 92a and 92b to first node X1 through diodes 30a and 30b and resistors 21a and 21b. Therefore, the increase in voltage of first node X1 becomes faster, and MOS transistor 56 is turned on at an earlier timing, as compared with an output circuit without resistors 21a and 21b as disclosed in, for example, Patent Literature 1 (Japanese Patent Application Laid-Open No. 2015-173214). As a result, the increase in voltage of first node X1 can be further suppressed, and output circuit 100 can be more reliably protected.

In a state in which output circuit 100 is mounted on a communication device (the state illustrated in FIG. 3), the voltages of first node X1 and node Y are equal to each other, and MOS transistor 56 is turned off. Therefore, clamp circuit 60 does not affect an operation of output circuit 100. Here, even in a state in which output circuit 100 is mounted on the communication device, there is a possibility that the voltage of first node X1 varies due to, for example, an operation of amplification of output circuit 100 or a voltage variation of external power supply 106. Therefore, it is desirable to appropriately design the threshold voltage and the like of clamp circuit 60 so that MOS transistor 56 is not erroneously turned on by such a voltage variation.

In output circuit 100 of the present embodiment, a power supply voltage side (first node X1) of clamp circuit 60 is biased with an output common-mode voltage generated by resistors 21a and 21b. Thus, in a state (no signal state) in which output circuit 100 is not performing an operation of amplification, anode-cathode voltages of diodes 30a and 30b become 0 V. Further, during the operation of amplifying and outputting a differential signal by output circuit 100, diodes 30a and 30b are not turned on and remain at a high resistance when the difference between the voltage of output signal terminals 92a and 92b and the output common-mode voltage is smaller than rising voltages (for example, 0.6 V) of diodes 30a and 30b.

When a voltage change of output signal terminals 92a and 92b with respect to the common-mode voltage is ±0.6 V, a maximum amplitude of an output signal is 1.2 V at single end and 2.4 V at differential. Note that "single end" refers to a voltage value for either one of output signal terminals 92a and 92b, and "differential" refers to, for example, a differential voltage between output signal terminal 92a and output signal terminal 92b. Even when diodes 30a and 30b are not turned on, depletion layers shrink and anode-cathode capacitances increase with an increase in forward voltages of diodes 30a and 30b. As a result, since the operating bandwidth of output circuit 100 is lowered as the forward voltage increases, it is desirable to set the forward voltages of diodes 30a and 30b to be low.

On the other hand, in the case where the power supply voltage side (a node corresponding to first node X1) of clamp circuit 60 is not biased and is floated as in the output circuit described in Patent Literature 1, for example, diodes 30a and 30b are turned on due to an operation of amplification by output circuit 100, so that there is a possibility that a waveform of the output signal is distorted by the turn-on of diodes 30a and 30b. This may deteriorate a linearity of the output signal. In addition, since the forward voltages of diodes 30a and 30b are large and the capacitances between the anodes and the cathodes are large, there is a possibility that the operating bandwidth of output circuit 100 is lowered.

Specifically, in a configuration where first node X1 is floated, in output circuit 100 in a no-signal state, the voltage of first node X1 is lower than the voltage of output signal terminals 92a and 92b by the rising voltage of diodes 30a and 30b because of a leakage current from first node X1 to ground line 80b. For example, when MOS transistor 56 is in an OFF state, the resistance between the drain and the source of MOS transistor 56 is much larger than the low resistance value (ON resistance) in an ON state. However, even when the resistance value is high, a slight leakage current flows between the drain and the source. As a result, the voltage of first node X1 becomes a voltage (for example, 3.4 V) lower than the output common-mode voltage (for example, 4.0 V) by the rising voltage (for example, 0.6 V). At this time, since forward voltages between the anodes and the cathodes of diodes 30a and 30b are high (for example, 0.6 V), capacitances between the anodes and the cathodes may increase and the operating bandwidth of output circuit 100 may decrease.

In the case of the floating configuration, when the voltage of output signal terminal 92a or the voltage of output signal terminal 92b is increased by an operation of amplification of output circuit 100, the forward voltage of diode 30a or the forward voltage of diode 30b becomes higher (for example, 0.6 V or more), resulting in the turn-on of diode 30a or diode 30b. As a result, a current (charge current) flows from output signal terminal 92a or output signal terminal 92b to first node X1, which may cause a problem such as a distortion of waveform of the output signal. The charge current stops when the voltage of first node X1 increases and the forward voltages of diodes 30a and 30b becomes equal to or lower than the rising voltages. Therefore, such a problem is particularly likely to occur immediately after output circuit 100 enters a state of an operation of amplification from a no-signal state. However, since the voltage of first node X1 gradually decreases due to the leakage current, there is a possibility that the charge current continues to be generated with a certain amount and frequency until the forward voltages of diodes 30a and 30b become equal to or lower than the rising voltages again.

The problem associated with the charge current described above in the case of the floating configuration may be more severe when input/output signals of output circuit 100 are analog signals (e.g., sine waves) rather than digital signals (e.g., rectangular waves). For example, when the input/output signals are rectangular waves, since the input/output signals are differential signals, either one of output signal terminals 92a and 92b is at a high level (maximum voltage), except for a high-low transition, and charging of first node X1 through diode 30a or diode 30b is fast. On the other hand, when the input/output signals are sine waves, since the input/output signals are almost always in a transition state and are lower than the maximum voltage, charging of first node X1 through diode 30a or diode 30b is slow, as compared with rectangular waves. As a result, in a case of analog signals, there is a possibility that a distortion of waveform of an output signal occurs more frequently over a long time during an operation of amplification, as compared with digital signals.

Similarly, the above-described problem associated with the charge current in the case of the floating configuration may become more significant when input/output signals of output circuit 100 are not modulation signals having constant amplitudes (for example, non-return to zero (NRZ) signals) but amplitude-modulated signals having multiple values (for example, pulse amplitude modulation (PAM) 4 signals). This is because a frequency at which amplitudes of the input/output signals become maximum values (peak-to-peak values) are lower in modulation signals whose amplitudes differ according to logical values than in modulation signals whose amplitudes are constant. As a result, charging of first node X1 through diode 30a or diode 30b becomes slow, and in the case of amplitude-modulated signals having multiple values, there is a possibility that a distortion of waveform of an output signal occurs more frequently over a long time during an operation of amplification, as compared with modulation signals having constant amplitudes.

In the present embodiment, for example, binary signals (for example, NRZ signals) with constant amplitudes, amplitude-modulated signals (for example, PAM4 signals) with multiple values, or the like are used as input and output signals. When input/output signals are amplitude-modulated signals having multiple values, there is a possibility that the above-described problem associated with a charge current in a case of the floating configuration becomes more significant. However, in the present embodiment, since first node X1 is electrically connected to second node X2, first node X1 is biased with an output common-mode voltage by resistors 21a and 21b, so that such a problem is suppressed. When voltage changes of output signal terminals 92a and 92b due to an output signal is larger than the rising voltages of diodes 30a and 30b, turn-on of the diodes can be avoided by adopting a configuration in which the number of stages of diodes is increased, for example, by adopting a configuration in which diodes 30a and 30b are each changed to two transistors connected in series to each other.

In this way, the configuration of output circuit 100 ensures that output circuit 100 is protected against ESD, because the path of the discharge current when ESD is input is configured with ESD protection diodes and resistors. In addition, by biasing clamp circuit 60 with an output common-mode voltage, it is possible to prevent an increase in capacitances between anodes and cathodes of the ESD protection diodes and the turn-on of the ESD protection diodes, thereby enabling an operation of amplification with a less distortion. As a result, it is possible to realize output circuit 100 that can perform an operation of amplification with a low distortion and is more reliable against ESD.

Figure 4:
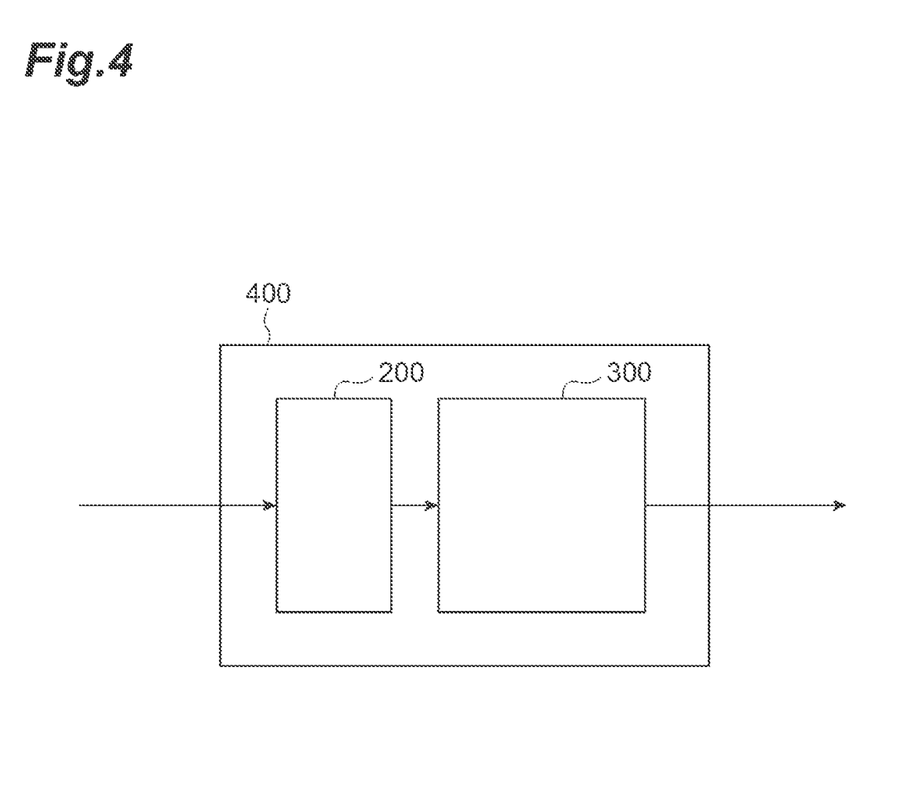
FIG. 4 is a block diagram illustrating a configuration of an optical transmitter module 400 according to an embodiment.

FIG. 4 illustrates a configuration of an optical transmitter module 400 according to the present embodiment. Optical transmitter module 400 includes drive circuit 200 described above and an optical modulator 300. Drive circuit 200 amplifies and outputs, for example, four input differential signals. Optical modulator 300 generates an optical signal modulated based on the four differential signals output from drive circuit 200 and outputs one optical signal which is subjected to, for example, polarization multiplexing QAM modulation. Alternatively, optical modulator 300 may generate four optical signals having mutually different peak wavelengths based on the four differential signals. For example, optical modulator 300 outputs four PAM-modulated optical signals. In this case, optical transmitter module 400 may further include an optical multiplexer and may generate and output one wavelength division multiplexed signal by multiplexing the four optical signals using the optical multiplexer. Optical transmitter module 400 is, for example, an optical module in which drive circuit 200 and optical modulator 300 are integrated and mounted in a ceramic package, and has an outer shape having a size of, for example, 30 mm×15 mm×5 mm. According to optical transmitter module 400 having the above-described configuration, since drive circuit 200 on which output circuit 100 is mounted is used, a highly reliable optical transmitter module that can generate an optical signal having a good waveform quality is realized.

Figure 5:
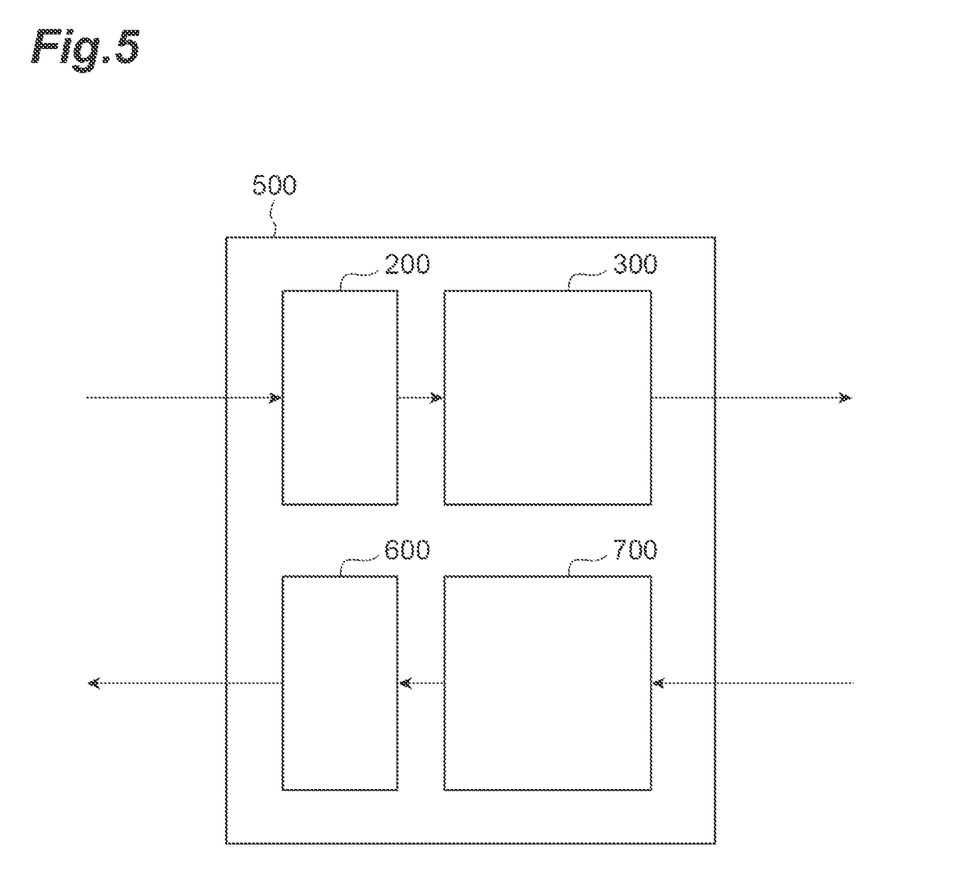
FIG. 5 is a block diagram illustrating a configuration of an optical transceiver module 500 according to an embodiment.

FIG. 5 illustrates a configuration of an optical transceiver module 500 according to the present embodiment. Optical transceiver module 500 includes a receiver circuit 600 and a photoreciever 700 in addition to drive circuit 200 and optical modulator 300 that are described above. Photoreciever 700 receives an optical signal input from the outside through an optical transmission path, and separates four signals (photocurrents) from the optical signal which is subjected to, for example, polarization multiplexing QAM modulation to output the separated signals. Receiver circuit 600 converts the four photocurrents to voltages, amplifies the voltages, and outputs the amplified voltages. According to optical transceiver module 500 having the above-described configuration, since drive circuit 200 on which output circuit 100 is mounted is used, a highly reliable optical transceiver module that can generate an optical signal having a good waveform quality is realized.

According to ESD protection circuit 65 of the present embodiment described above, when a positive ESD voltage is input to the pair of output signal terminals 92a and 92b, a discharge current can flow from the pair of diodes 30a and 30b to ground line 80b through first node X1 by an operation of clamp circuit 60, and dielectric breakdown of internal circuit 67 can be prevented to achieve ESD protection.

First node X1 and second node X2 which is an output of intermediate voltage circuit 21 are electrically connected to each other. With this configuration, when a positive ESD voltage is input to the pair of output signal terminals 92a and 92b, a voltage of first node X1 can be rapidly increased, so that internal circuit 67 is more reliably protected against ESD. In addition, during an operation of amplification, it is possible to suppress a decrease in operation bandwidth of output circuit 100 due to an increase in capacitances between anodes and cathodes of diodes 30a and 30b, and it is also possible to reduce a distortion of waveform in an output signal.

Furthermore, intermediate voltage circuit 21 of ESD protection circuit 65 includes resistor 21a which is connected between output signal terminals 92a and second node X2, and resistor 21b which is connected between output signal terminal 92b and second node X2. With this simple circuit configuration, a voltage can be generated at second node X2, and as a result, the certainty of protection of internal circuit 67 against ESD can be improved.

Clamp circuit 60 includes detection circuit 70 that generates a trigger signal in response to an intermediate voltage having become larger than a predetermined value, and switch circuit 71 that sets a resistance between first node X1 and a ground line to a low resistance value (first resistance value) in accordance with the trigger signal. In this case, since first node X1 is connected to the ground line with the low resistance value in accordance with the voltage change of first node X1, it is possible to prevent a discharge current due to ESD from flowing into internal circuit 67 and to realize the ESD protection more reliably.

Detection circuit 70 includes resistor 22 which is connected between first node X1 and node Y, and capacitor 40 which is connected between node Y and a ground line. Detection circuit 70 generates a trigger signal when the difference between a voltage of node X1 and a voltage of node Y becomes larger than a predetermined value. With this configuration, the voltage change of first node X1 can be detected to generate a trigger signal, and as a result, the reliability of ESD protection can be improved.

Detection circuit 70 also generates a trigger signal during a predetermined period of time in response to the intermediate voltage having increased. According to this configuration, it is possible to detect a voltage change of first node X1 and generate a trigger signal during a predetermined period of time, prevent clamp circuit 60 from affecting an output signal when output circuit 100 performs an operation of amplification, and consequently improve the reliability of ESD protection without deteriorating a waveform quality of the output signal.

Detection circuit 70 also includes an inverter circuit that inverts a voltage of node Y and generates a trigger signal. In this case, the trigger signal can be generated by detecting a voltage change of first node X1, and it is possible to improve the reliability of ESD protection.

Switch circuit 71 includes a switching element that switches, in accordance with a trigger signal, between a conduction state in which first node X1 and a ground line are in electrical conduction with each other and a non-conduction state in which first node X1 and the ground line are not in electrical conduction with each other. With this configuration of switch circuit 71, since first node X1 is connected to the ground line in accordance with a voltage change of first node X1, ESD protection can be more reliably realized.

ESD protection circuit 65 includes diodes 30a and 30b. A cathode of diode 30a and a cathode of diode 30b are connected to first node X1. An anode of diode 30a is connected to output signal terminal 92a, and an anode of diode 30b is connected to output signal terminal 92b. In this case, when a positive ESD voltage is input to the pair of output signal terminals 92a and 92b, a discharge current can flow toward first node X1 through the pair of diodes 30a and 30b and, thus stable ESD protection can be realized.

In addition, in output circuit 100 including ESD protection circuit 65 and internal circuit 67 of the present embodiment, stable ESD protection is realized by ESD protection circuit 65, and internal circuit 67 can be sufficiently protected.

Internal circuit 67 preferably generates a differential output signal in accordance with a differential input signal and outputs the differential output signal to the pair of output signal terminals 92a and 92b. In this case, ESD protection can be achieved when an ESD voltage is input to the pair of output signal terminals 92a and 92b.

While the principles of the present invention have been illustrated and described in preferred embodiments, it will be appreciated by those skilled in the art that the invention may be modified in arrangement and detail without departing from such principles. The present invention is not limited to the specific configurations disclosed in this embodiment. Accordingly, it is claimed that all modifications and changes come from the scope of the claims and their spirit.

The configuration of clamp circuit 60 in ESD protection circuit 65 may be changed as appropriate. For example, a detection circuit having a configuration of a low pass filter may be changed to a configuration of a high pass filter in which connection positions of a resistor and a capacitor are switched, or a configuration of a capacitance voltage-dividing circuit in which a plurality of capacitors are connected in series.

In this case, the output voltage of the detection circuit changes substantially at the same time as first node X1, and returns to zero after a certain period of time. Therefore, in clamp circuit 60, the inverter circuit is omitted, or the inverter circuit is configured by two or more even-numbered stages.

In addition, although output circuit 100 of the present embodiment is configured as an open collector circuit, a resistor may be inserted between output signal terminals 92a and 92b and the internal power supply or between output signal terminals 92a and 92b and the ground line when the operation of output circuit 100 is not affected. For example, resistors having resistance values (for example, 300Ω) ten times or more as large as resistance values of load resistors 104a and 104b of external load 102 can be inserted between output signal terminal 92a and the internal power supply (for example, 3.3 V) and between output signal terminal 92b and the internal power supply, respectively. In this case, a combined load resistance is about 90% of the resistance values of load resistors 104a and 104b. Such a circuit can also be regarded substantially as an open collector circuit.

Figure 6:
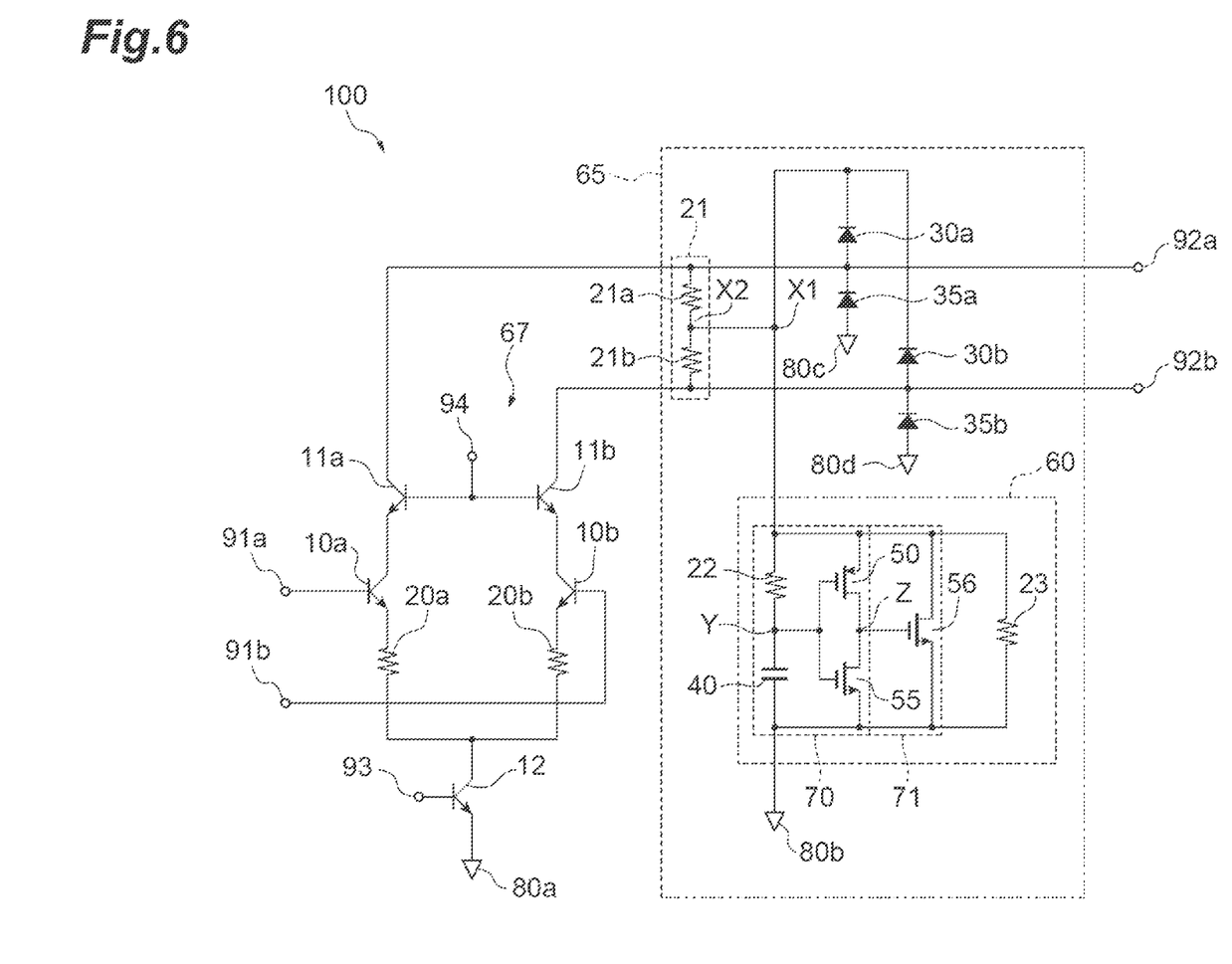
FIG. 6 is a circuit diagram illustrating a configuration of an output circuit 100 according to a modification.

As in the configuration of output circuit 100 according to the modification illustrated in FIG. 6, a resistor 23 may be inserted between first node X1 and ground terminal 80b. In the case of such a configuration, resistor 23 and resistors 21a and 21b function as pull-down resistors to prevent output signal terminals 92a and 92b from being charged. As a result, it is possible to prevent a failure that may occur when charges that are charged at output signal terminals 92a and 92b are externally discharged, and to improve the reliability of output circuit 100.

Figure 7:
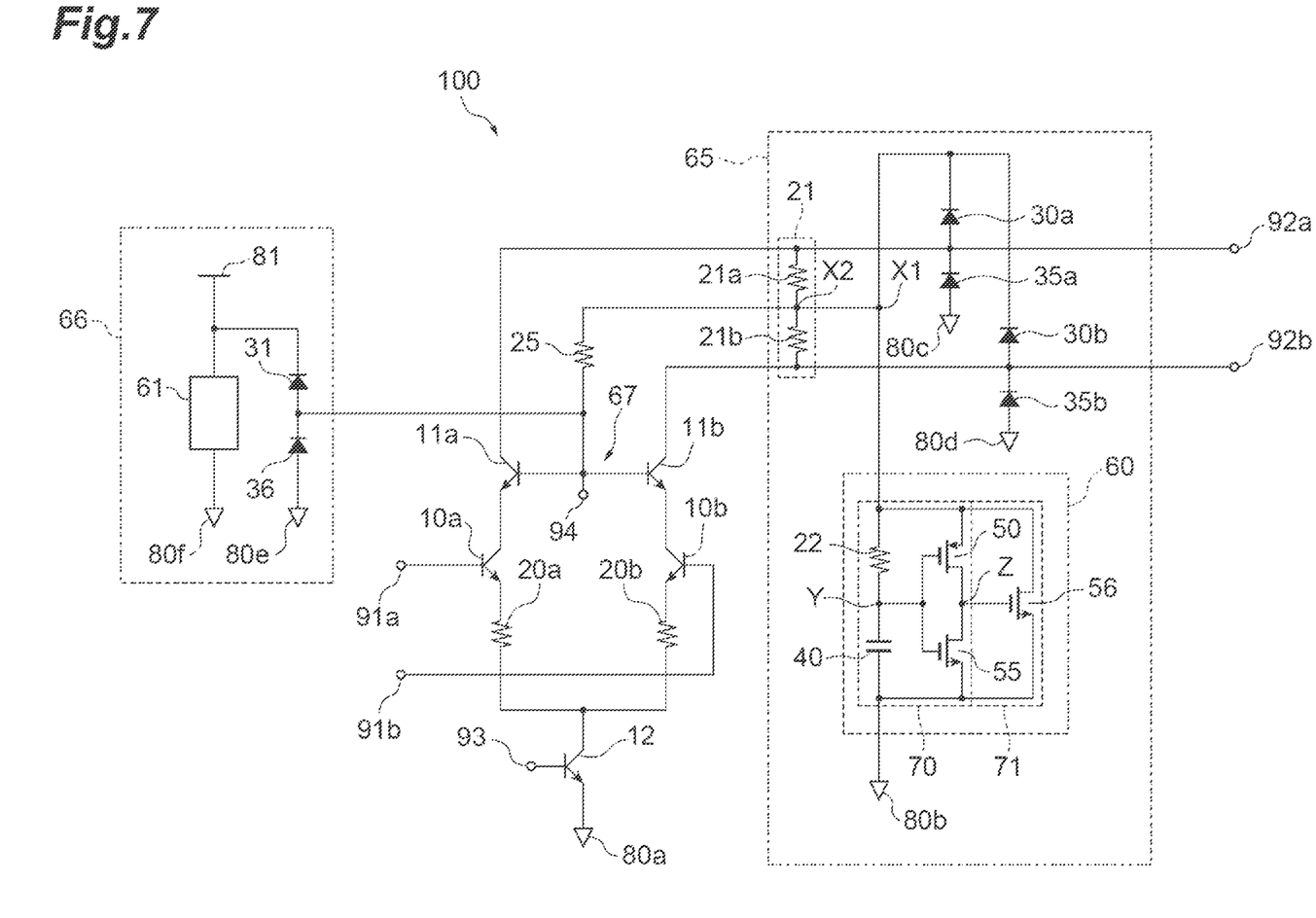
FIG. 7 is a circuit diagram illustrating a configuration of an output circuit 100 according to a modification.

FIG. 7 illustrates a configuration of another modification of output circuit 100. This modification is different from the above-described embodiment in that a resistor 25 and an ESD protection circuit 66 for bipolar transistors 11a and 11b are added.

As illustrated in FIG. 7, ESD protection circuit 66 includes diodes 31 and 36, a clamp circuit 61, ground lines 80e and 80f, and a power supply line 81. Diode 31 is connected between bias supply terminal 94 and power supply line 81. Diode 36 is connected between bias supply terminal 94 and ground line 80e. Clamp circuit 61 is connected between power supply line 81 and ground line 80f. Resistor 25 is connected between second node X2 and bias supply terminal 94.

In output circuit 100 of the above embodiment, since bases of bipolar transistors 11a and 11b are separated from the external power supply, there is a possibility that voltages between bases and collectors of bipolar transistors 11a and 11b exceed a maximum rating when ESD occurs. On the other hand, in output circuit 100 of this modification, resistor 25 (for example, a resistance value of 1 kΩ) is inserted between bias supply terminal 94 and second node X2. As a result, for example, when a positive ESD voltage is input to output signal terminals 92a and 92b, the bases of bipolar transistors 11a and 11b are also charged through resistors 21a, 21b, and 25, so that an increase in the voltages between the bases and the collectors is suppressed. In addition, when voltages between bases and emitters of bipolar transistors 11a and 11b increase, a collector current flows and charges the emitters, so that an increase in the voltages between the bases and the emitters is suppressed. Further, the increase in the base voltages themselves is suppressed by ESD protection circuit 66. In this way, it is possible to reduce a possibility that bipolar transistors 11a and 11b are affected by ESD.

Here, a voltage of, for example, 2.5 V is supplied to bias supply terminal 94. A voltage of, for example, 3.3 V is supplied to power supply terminal 81 from the internal power supply. In this case, a reverse bias voltage between the anode and the cathode of diode 31 is, for example, 0.8 V, and diode 31 is not turned on. A plurality of diodes may be connected in series between bias supply terminal 94 and power supply line 81.

As described above, in this modification, it is possible to reduce the possibility that bipolar transistors 11a and 11b are affected by ESD, as compared with the above-described embodiment. This allows a more reliable output circuit to be realized.

Figure 8:
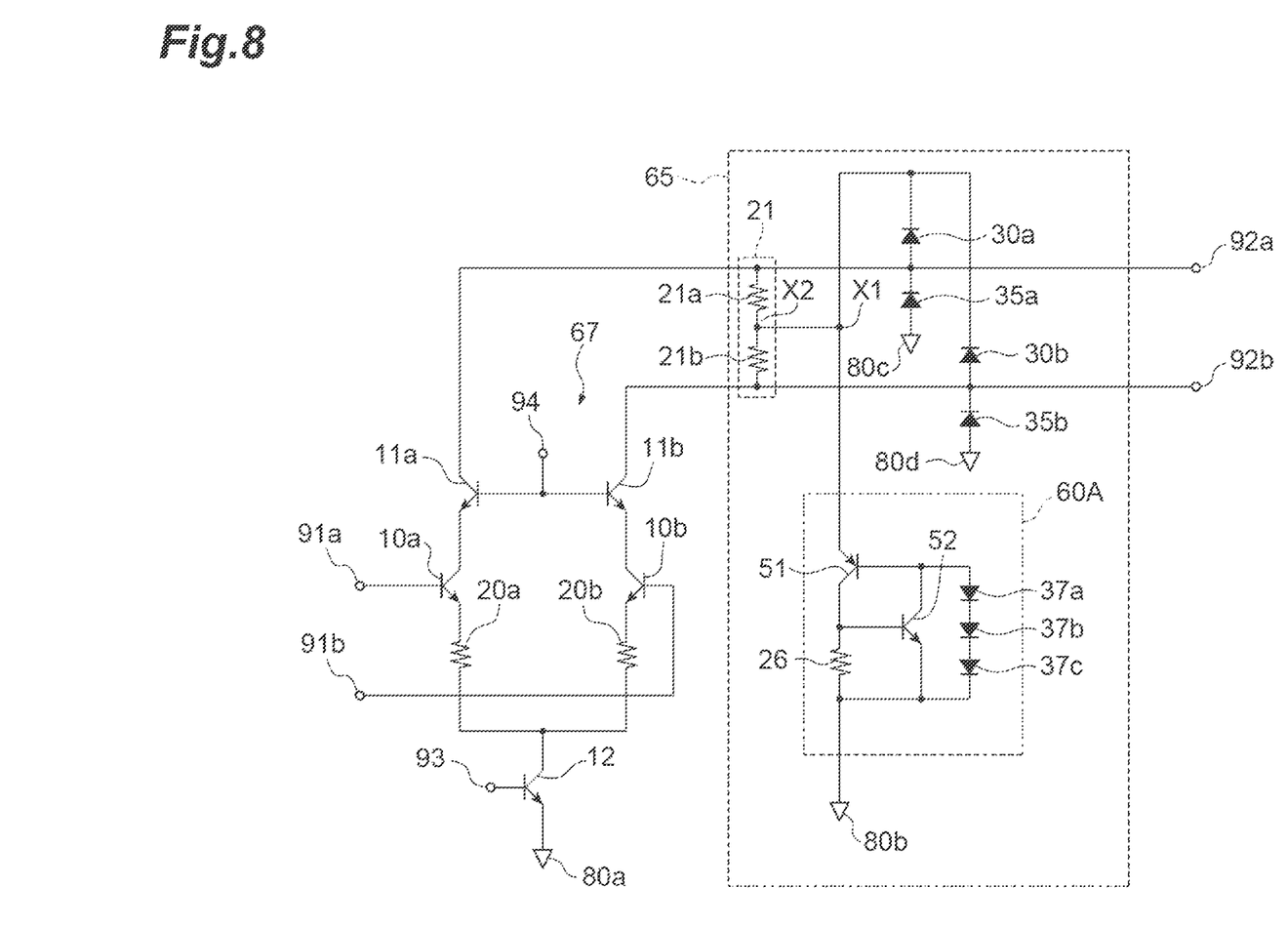
FIG. 8 is a circuit diagram illustrating a configuration of an output circuit 100 according to a modification.

Also illustrated in FIG. 8 is a configuration of another modification of output circuit 100. This modification differs from the above-described embodiment in the configuration of clamp circuit 60A.

As illustrated in FIG. 8, clamp circuit 60A includes bipolar transistors 51 and 52, a resistor 26, and diodes 37a, 37b, and 37c. Clamp circuit 60A is a so-called diode triggered silicon controlled rectifier (DTSCR). Bipolar transistor 51 is a PNP-type bipolar transistor, and has an emitter that is connected to first node X1 and a collector that is connected to ground line 80b through resistor 26. Bipolar transistor 52 is an NPN-type bipolar transistor, and has a collector that is connected to the base of bipolar transistor 51, an emitter that is connected to ground line 80b, and a base that is connected to the collector of bipolar transistor 51. Diodes 37a, 37b, and 37c are connected in series between the base of bipolar transistor 51 and ground line 80b.

In clamp circuit 60A having such a configuration, when a voltage of second node X2 increases, a current flows from the emitter of bipolar transistor 51 through the base of bipolar transistor 51 and diodes 37a, 37b, and 37c. As a result, a thyristor including bipolar transistors 51 and 52 is turned on, and a discharge current flows from the emitter of bipolar transistor 51 through the collector of bipolar transistor 51, the base of bipolar transistor 52, and the emitter of bipolar transistor 52. As a result, internal circuit 67 is protected from ESD. When an ESD current (discharge current) which flows from output signal terminal 92a or output signal terminal 92b flows into the thyristor and then becomes zero, the thyristor automatically recovers to an off state.

The modification of such a configuration can also realize a highly reliable output circuit that can perform an operation of amplification with a low distortion. Instead of the diode triggered silicon controlled rectifier, it is also possible to use a gate-grounded NMOS (ggNMOS) or a Zener diode.

What is claimed is:

1. An electrostatic protection circuit comprising:
a first output terminal and a second output terminal;
a common node having an intermediate voltage;
a first diode connected between the first output terminal and the common node;
a second diode connected between the second output terminal and the common node;
an intermediate voltage circuit including a first dividing resistor and a second dividing resistor, the first dividing resistor being connected between the first output terminal and the common node in parallel with the first diode, the second dividing resistor being connected between the second output terminal and the common node in parallel with the second diode; and
a clamp circuit connected between the common node and a ground line, the clamp circuit being configured to electrically connect the common node to the ground line in accordance with the intermediate voltage.

2. The electrostatic protection circuit according to claim 1, wherein the intermediate voltage circuit includes a first dividing resistor and a second dividing resistor, the first dividing resistor being connected between the first output terminal and the common node, and the second dividing resistor being connected between the second output terminal and the common node.

3. The electrostatic protection circuit according to claim 1, wherein the clamp circuit includes a detection circuit and a switch circuit, the detection circuit being configured to generate a trigger signal in response to the intermediate voltage having become larger than a predetermined value, and the switch circuit being configured to electrically connect the common node to the ground line in accordance with the trigger signal.

4. The electrostatic protection circuit according to claim 3,
wherein the detection circuit includes a detection node, a detection resistor connected between the common node and the detection node, and a capacitor connected between the detection node and the ground line, and wherein the detection circuit is configured to generate the trigger signal in accordance with a voltage of the detection node.

5. The electrostatic protection circuit according to claim 4, wherein the detection circuit further includes an inverter circuit configured to generate the trigger signal by inverting a voltage of the detection node.

6. The electrostatic protection circuit according to claim 3, wherein the detection circuit generates the trigger signal during a predetermined period of time in response to the intermediate voltage having increased.

7. The electrostatic protection circuit according to claim 3, wherein the switch circuit includes a switching element configured to switch, in accordance with the trigger signal, between a conduction state in which the common node and the ground line are in electrical conduction with each other by setting a resistance between the common node and the ground line to a first resistance and a non-conduction state in which the common node and the ground line are in electrical non-conduction with each other by setting a resistance between the common node and the ground line to a second resistance greater than the first resistance.

8. The electrostatic protection circuit according to claim 1, wherein the first diode circuit includes a first diode having a cathode connected to the common node and an anode connected to the first output terminal, and wherein the second diode circuit includes a second diode having a cathode connected to the common node and an anode connected to the second output terminal.

9. A semiconductor integrated circuit comprising:
the electrostatic protection circuit according to claim 1; and
a differential amplifier circuit electrically connected to the first output terminal and the second output terminal.

10. The semiconductor integrated circuit according to claim 9, wherein the differential amplifier circuit is configured to generate a differential output signal in accordance with a differential input signal and outputs the differential output signal to the first output terminal and the second output terminal.

11. The electrostatic protection circuit according to claim 1, wherein the intermediate voltage circuit further includes a third resistor inserted between the common mode and the ground line.

12. An electrostatic protection circuit comprising:
a first output terminal and a second output terminal;
a common node having an intermediate voltage;
a first diode connected between the first output terminal and the common node;
a second diode connected between the second output terminal and the common node;
an intermediate voltage circuit including a first dividing resistor and a second dividing resistor, the first dividing resistor being connected between the first output terminal and the common node in parallel with the first diode, the second dividing resistor being connected between the second output terminal and the common node in parallel with the second diode; and
a clamp circuit connected between the common node and a ground line, the clamp circuit being configured to electrically connect the common node to the ground line in accordance with the intermediate voltage, wherein
the clamp circuit includes a first bipolar transistor, a second bipolar transistor, a resistor, and a diode,
the first bipolar transistor having a first emitter, a first collector, and a first base, the first emitter being connected to the common node, the first collector being connected to the ground line through the resistor,
the second bipolar transistor having a second emitter, a second collector, and a second base, the first base being connected to the second collector, the first collector being connected to the second base, the second emitter being connected to the ground line, and
the diode being connected between the second collector and the second emitter.

\* \* \* \* \*